United States Patent
Hu et al.

(10) Patent No.: US 11,328,639 B2
(45) Date of Patent: May 10, 2022

(54) SHIFT REGISTER CIRCUIT AND DRIVE METHOD THEREOF, GATE DRIVE CIRCUIT, AND DISPLAY PANEL

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Zuquan Hu, Beijing (CN); Xiaoye Ma, Beijing (CN); Rui Ma, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 236 days.

(21) Appl. No.: 16/015,745

(22) Filed: Jun. 22, 2018

(65) Prior Publication Data

US 2019/0066562 A1 Feb. 28, 2019

(30) Foreign Application Priority Data

Aug. 22, 2017 (CN) .......................... 201710728420.5

(51) Int. Cl.
| | | |
|---|---|---|
| G11C 19/00 | (2006.01) | |
| G09G 3/20 | (2006.01) | |
| G11C 19/28 | (2006.01) | |
| G09G 3/36 | (2006.01) | |
| G09G 3/3266 | (2016.01) | |

(52) U.S. Cl.
CPC ............. *G09G 3/20* (2013.01); *G09G 3/3677* (2013.01); *G11C 19/28* (2013.01); *G09G 3/3266* (2013.01); *G09G 2310/0286* (2013.01); *G09G 2310/061* (2013.01)

(58) Field of Classification Search
None
See application file for complete search history.

(56) References Cited

U.S. PATENT DOCUMENTS

2012/0269316 A1* 10/2012 Jang ..................... G09G 3/3677
377/75
2013/0088480 A1 4/2013 Hong et al.
(Continued)

FOREIGN PATENT DOCUMENTS

| CN | 103700356 A | 4/2014 |
|---|---|---|
| CN | 103928009 A | 7/2014 |

(Continued)

OTHER PUBLICATIONS

Second Office Action for CN Appl. No. 201710728420.5, dated Sep. 29, 2019.

(Continued)

*Primary Examiner* — Tuan T Lam
(74) *Attorney, Agent, or Firm* — Dinsmore & Shohl LLP

(57) ABSTRACT

The present disclosure relates to a shift register circuit and a drive method thereof, a gate drive circuit, and a display panel. The shift register circuit comprises a second reset circuit, and a reset operation is performed for a first node and a signal output terminal by the second reset circuit during an off stage of the display panel.

14 Claims, 7 Drawing Sheets

(56) References Cited

U.S. PATENT DOCUMENTS

| | | | | |
|---|---|---|---|---|
| 2014/0056399 A1* | 2/2014 | Shang | ............... | G11C 19/28 377/68 |
| 2014/0118237 A1* | 5/2014 | Wang | ............... | G11C 19/28 345/100 |
| 2014/0133621 A1* | 5/2014 | Shang | ............... | G11C 19/184 377/67 |
| 2015/0016584 A1* | 1/2015 | Dun | ............... | G11C 27/04 377/68 |
| 2015/0187320 A1* | 7/2015 | Ren | ............... | G09G 3/3696 345/87 |
| 2015/0213762 A1* | 7/2015 | Xia | ............... | G09G 3/3266 345/215 |
| 2015/0332632 A1 | 11/2015 | Nakata et al. | | |
| 2016/0155422 A1* | 6/2016 | Sun | ............... | G09G 3/20 345/213 |
| 2016/0187917 A1* | 6/2016 | Lou | ............... | G09G 3/2096 345/213 |
| 2017/0039978 A1* | 2/2017 | Wang | ............... | G09G 3/36 |
| 2017/0092375 A1* | 3/2017 | Xia | ............... | G09G 3/3674 |
| 2017/0278473 A1* | 9/2017 | Shang | ............... | G09G 3/36 |
| 2018/0174659 A1* | 6/2018 | Shao | ............... | G09G 3/3677 |
| 2019/0057755 A1* | 2/2019 | Xiong | ............... | G11C 19/287 |
| 2019/0206503 A1* | 7/2019 | Zhang | ............... | G11C 19/287 |

FOREIGN PATENT DOCUMENTS

| | | | |
|---|---|---|---|
| CN | 104715733 A | | 6/2015 |
| CN | 105096902 A | | 11/2015 |
| CN | 204966019 | | 1/2016 |
| CN | 1055528986 | * | 4/2016 |
| CN | 106409207 A | | 2/2017 |
| CN | 106652875 | | 5/2017 |
| CN | 106652876 | | 5/2017 |
| CN | 206349133 U | | 7/2017 |

OTHER PUBLICATIONS

First Office Action for CN Appl. No. 201710728420.5, dated May 8, 2019 (32 pages).

* cited by examiner during an on stage of the display panel, under the control of the second reset terminal, the second reset circuit provides a signal of the third power source terminal to the first node and the signal output terminal; ~100 under the control of the signal input terminal, the input circuit provides a signal of the signal input terminal to the first node; ~200 under the control of the first node, the output circuit provides a signal of the clock signal terminal to the signal output terminal; ~300 under the control of the first reset terminal, the first reset circuit provides a signal of the second power source terminal to the first node and the signal output terminal; ~400 under the control of the first power source terminal, the pull-down circuit provides a signal of the second power source terminal to the first node and the signal output terminal; ~500

~600
during an off stage of the display panel, under the control of the second reset terminal, the second reset circuit provides a signal of the third power source terminal to the first node and the signal output terminal.

FIG. 7

SHIFT REGISTER CIRCUIT AND DRIVE METHOD THEREOF, GATE DRIVE CIRCUIT, AND DISPLAY PANEL

CROSS-REFERENCE TO RELATED APPLICATIONS

The present application claims priority to Chinese Patent Application No. 201710728420.5 that was filed on Aug. 22, 2017, the disclosure of which is entirely incorporated herein by reference.

TECHNICAL FIELD

Embodiments of the present disclosure relate to a shift register circuit and a drive method thereof, a gate drive circuit, and a display panel.

BACKGROUND

In recent years, flat panel displays, such as a Thin Film Transistor-Liquid Crystal Display (TFT-LCD) panel and an Active Matrix Organic Light Emitting Diode (AMOLED) panel, are widely used for a TV set, a mobile phone, or other electronics, due to a light weight, a thin thickness, a low power consumption, and other advantages.

With the development of science and technologies, a display panel with a high resolution and a narrow frame becomes the development trend. For this reason, a Gate Driver on Array (GOA) technology occurs. The GOA technology is directed to a technology of arranging a GOA circuit for driving gate lines on both sides of an effective display area of the array substrate in the display panel, wherein the GOA circuit includes a plurality of shift registers.

In a current GOA circuit, during an off stage of the display panel, a transistor in charge of outputting a gate drive signal in the shift register and a transistor of a corresponding display area are in a high level state to achieve an off screen of the display panel. The inventor of the present application has found that, if a related GOA circuit wants to frequently perform an on/off operation for the display panel, the transistor in charge of outputting a gate drive signal in the shift register and the transistor of the corresponding display area will be in a high level state for a long time.

SUMMARY

According to some embodiments of the present disclosure, there is provided a shift register circuit, arranged in a display panel, comprising: an input circuit, an output circuit, a pull-down circuit, a first reset circuit, and a second reset circuit. The input circuit is connected to a signal input terminal and a first node, and is configured to provide a signal of the signal input terminal to the first node under control of the signal input terminal. The output circuit is connected to a clock signal terminal, the first node, and a signal output terminal, and is configured to provide a signal of the clock signal terminal to the signal output terminal under control of the first node. The pull-down circuit is connected to the first node, a first power source terminal, a second power source terminal, and the signal output terminal, and is configured to provide a signal of the second power source terminal to the first node and the signal output terminal under control of the first power source terminal. The first reset circuit is connected to a first reset terminal, the second power source terminal, the first node, and the signal output terminal, and is configured to provide a signal of the second power source terminal to the first node and the signal output terminal under control of the first reset terminal. The second reset circuit is connected to a second reset terminal, a third power source terminal, the first node, and the signal output terminal, and is configured to provide a signal of the third power source terminal to the first node and the signal output terminal under control of the second reset terminal.

According to some embodiments of the present disclosure, wherein the second reset circuit is further configured to provide the signal of the third power source terminal to the first node and the signal output terminal under control of the second reset terminal, during on and off stages of the display panel.

According to some embodiments of the present disclosure, the input circuit includes a first transistor. Of the first transistor, a gate and a first electrode are connected to the signal input terminal, a second electrode is connected to the first node; and the output circuit includes a second transistor and a capacitor. Of the second transistor, a gate is connected to the first node, a first electrode is connected to the clock signal terminal, and a second electrode is connected to the signal output terminal. Of the capacitor, one terminal is connected to the first node, and the other terminal is connected to the signal output terminal.

According to some embodiments of the present disclosure, the first reset circuit includes a third transistor and a fourth transistor. Of the third transistor, a gate is connected to the first reset terminal, a first electrode is connected to the first node, and a second electrode is connected to the second power source terminal. Of the fourth transistor, a gate is connected to the first reset terminal, a first electrode is connected to the signal output terminal, and a second electrode is connected to the second power source terminal.

According to some embodiments of the present disclosure, the second reset circuit includes a fifth transistor and a sixth transistor. Of the fifth transistor, a gate is connected to the second reset terminal, a first electrode is connected to the first node, and a second electrode is connected to the third power source terminal. Of the sixth transistor, a gate is connected to the second reset terminal, a first electrode is connected to the signal output terminal, and a second electrode is connected to the third power source terminal.

According to some embodiments of the present disclosure, the pull-down circuit includes a seventh transistor, an eighth transistor, a ninth transistor, and a tenth transistor. Of the seventh transistor, a gate and a first electrode are connected to the first power source terminal, and a second electrode is connected to a second node. Of the eighth transistor, a gate is connected to the first node, a first electrode is connected to the second node, and a second electrode is connected to the second power source terminal. Of the ninth transistor, a gate is connected to the second node, a first electrode is connected to the first node, and a second electrode is connected to the second power source terminal. Of the tenth transistor, a gate is connected to the second node, a first electrode is connected to the signal output terminal, and a second electrode is connected to the second power source terminal.

According to some embodiments of the present disclosure, the pull-down circuit includes a seventh transistor, an eighth transistor, a ninth transistor, a tenth transistor, an eleventh transistor, and twelfth transistor. Of the seventh transistor, a gate and a first electrode are connected to the first power source terminal, and a second electrode is connected to a third node. Of the eighth transistor, a gate is connected to the third node, a first electrode is connected to the first power source terminal, and a second electrode is connected to the second node. Of the ninth transistor, a gate is connected to the first node, a first electrode is connected to the third node, and a second electrode is connected to the second power source terminal. Of the tenth transistor, a gate is connected to the first node, a first electrode is connected to the second node, and a second electrode is connected to the second power source terminal. Of the eleventh transistor, a gate is connected to the second node, a first electrode is connected to the first node, and a second electrode is connected to the second power source terminal. Of the twelfth transistor, a gate is connected to the second node, a first electrode is connected to the signal output terminal, and a second electrode is connected to the second power source terminal.

According to some embodiments of the present disclosure, a potential of a signal of the second power source terminal is less than that of the third power source terminal.

According to some embodiments of the present disclosure, there is provided a gate drive circuit, comprising: a plurality of cascaded stages of any shift register circuit as described above. A second reset terminal of each stage of the shift register circuit is connected to a reset terminal. A signal input terminal of a first stage of the shift register circuit is connected to an initial signal input terminal. A signal input terminal of an Nth stage of the shift register circuit is connected to a signal output terminal of an (N−1)th stage of the shift register circuit. A signal output terminal of the Nth stage of the shift register circuit is connected to a first reset terminal of the (N−1)th stage of the shift register circuit. N is a positive integer greater than or equal to 2.

According to some embodiments of the present disclosure, a clock signal terminal of an odd-numbered stage of the shift register circuit is connected to a first clock signal terminal, and a clock signal terminal of an even-numbered stage of the shift register circuit is connected to a second clock signal terminal. A signal of the first clock signal terminal is an inverted signal of a signal of the second clock signal terminal.

According to some embodiments of the present disclosure, in each shift register circuit, the input circuit includes a first transistor. Of the first transistor, a gate and a first electrode are connected to the signal input terminal, and a second electrode is connected to the first node. The output circuit includes a second transistor and a capacitor. Of the second transistor, a gate is connected to the first node, a first electrode is connected to the clock signal terminal, and a second electrode is connected to the signal output terminal. Of the capacitor, one terminal is connected to the first node, and the other terminal is connected to the signal output terminal.

According to some embodiments of the present disclosure, in each shift register circuit, the input circuit includes a first transistor. Of the first transistor, a gate and a first electrode are connected to the signal input terminal, and a second electrode is connected to the first node. The output circuit includes a second transistor and a capacitor. Of the second transistor, a gate is connected to the first node, a first electrode is connected to the clock signal terminal, and a second electrode is connected to the signal output terminal. Of the capacitor, one terminal is connected to the first node, and the other terminal is connected to the signal output terminal.

According to some embodiments of the present disclosure, in each shift register circuit, the first reset circuit includes a third transistor and a fourth transistor. Of the third transistor, a gate is connected to the first reset terminal, a first electrode is connected to the first node, and a second electrode is connected to the second power source terminal. Of the fourth transistor, a gate is connected to the first reset terminal, a first electrode is connected to the signal output terminal, and a second electrode is connected to the second power source terminal.

According to some embodiments of the present disclosure, in each shift register circuit, the second reset circuit includes a fifth transistor and a sixth transistor. Of the fifth transistor, a gate is connected to the second reset terminal, a first electrode is connected to the first node, and a second electrode is connected to the third power source terminal. Of the sixth transistor, a gate is connected to the second reset terminal, a first electrode is connected to the signal output terminal, and a second electrode is connected to the third power source terminal.

According to some embodiments of the present disclosure, in each shift register circuit, the pull-down circuit includes a seventh transistor, an eighth transistor, a ninth transistor, and a tenth transistor. Of the seventh transistor, a gate and a first electrode are connected to the first power source terminal, and a second electrode is connected to a second node. Of the eighth transistor, a gate is connected to the first node, a first electrode is connected to the second node, and a second electrode is connected to the second power source terminal. Of the ninth transistor, a gate is connected to the second node, a first electrode is connected to the first node, and a second electrode is connected to the second power source terminal. Of the tenth transistor, a gate is connected to the second node, a first electrode is connected to the signal output terminal, and a second electrode is connected to the second power source terminal.

According to some embodiments of the present disclosure, in each shift register circuit, the pull-down circuit includes a seventh transistor, an eighth transistor, a ninth transistor, a tenth transistor, an eleventh transistor, and twelfth transistor. Of the seventh transistor, a gate and a first electrode are connected to the first power source terminal, and a second electrode is connected to a third node. Of the eighth transistor, a gate is connected to the third node, a first electrode is connected to the first power source terminal, and a second electrode is connected to the second node. Of the ninth transistor, a gate is connected to the first node, a first electrode is connected to the third node, and a second electrode is connected to the second power source terminal. Of the tenth transistor, a gate is connected to the first node, a first electrode is connected to the second node, and a second electrode is connected to the second power source terminal. Of the eleventh transistor, a gate is connected to the second node, a first electrode is connected to the first node, and a second electrode is connected to the second power source terminal. Of the twelfth transistor, a gate is connected to the second node, a first electrode is connected to the signal output terminal, and a second electrode is connected to the second power source terminal.

According to some embodiments of the present disclosure, in each shift register circuit, a potential of a signal of the second power source terminal is less than that of the third power source terminal.

According to some embodiments of the present disclosure, there is provided a drive method of a shift register circuit, comprising: during an on stage of a display panel, under control of a second reset terminal, a second reset circuit provides a signal of a third power source terminal to a first node and a signal output terminal; under control of a signal input terminal, an input circuit provides a signal of the signal input terminal to the first node; under control of the first node, an output circuit provides a signal of a clock signal terminal to the signal output terminal; under control of a first reset terminal, a first reset circuit provides a signal of a second power source terminal to the first node and the signal output terminal; under control of a first power source terminal, a pull-down circuit provides a signal of the second power source terminal to the first node and the signal output terminal; during an off stage of the display panel, under control of the second reset terminal, the second reset circuit provides a signal of a third power source terminal to the first node and the signal output terminal.

According to some embodiments of the present disclosure, there is provided a display panel, comprising any of the shift register circuits as described above.

According to some embodiments of the present disclosure, there is provided a display panel, comprising any of the gate drive circuits as described above.

Certainly, any one product or method for implementing the present disclosure does not necessarily need to reach all the aforementioned advantages at the same time. Other features and advantages of the present disclosure will be explained in the following embodiments of the Description, and partially become obvious in the embodiments of the Description or can be understood by implementing the present disclosure. Objectives and other advantages of embodiments of the present disclosure may be achieved and obtained by structures as particularly directed in the Description, Claims and Drawings.

BRIEF DESCRIPTION OF THE DRAWINGS

The drawings are used to provide a further understanding of technical solutions of embodiments of the present disclosure, and constitute a portion of the Description. The drawings, together with embodiments of the present application, are used to interpret technical solutions of embodiments of the present disclosure, and cannot constitute a limit to technical solutions of embodiments of the present disclosure.

FIG. 7 is a flow diagram of a drive method of a shift register circuit provided according to some embodiments of the present disclosure;

DETAILED DESCRIPTION

In order to make the objectives, technical solutions, and advantages of the present invention clearer and more comprehensible, embodiments of the present disclosure are described in detail in the following with reference to the accompanying drawings. It should be noted that, embodiments and features therein in the present application may be mutually and arbitrarily combined, without collisions.

Figure 1:
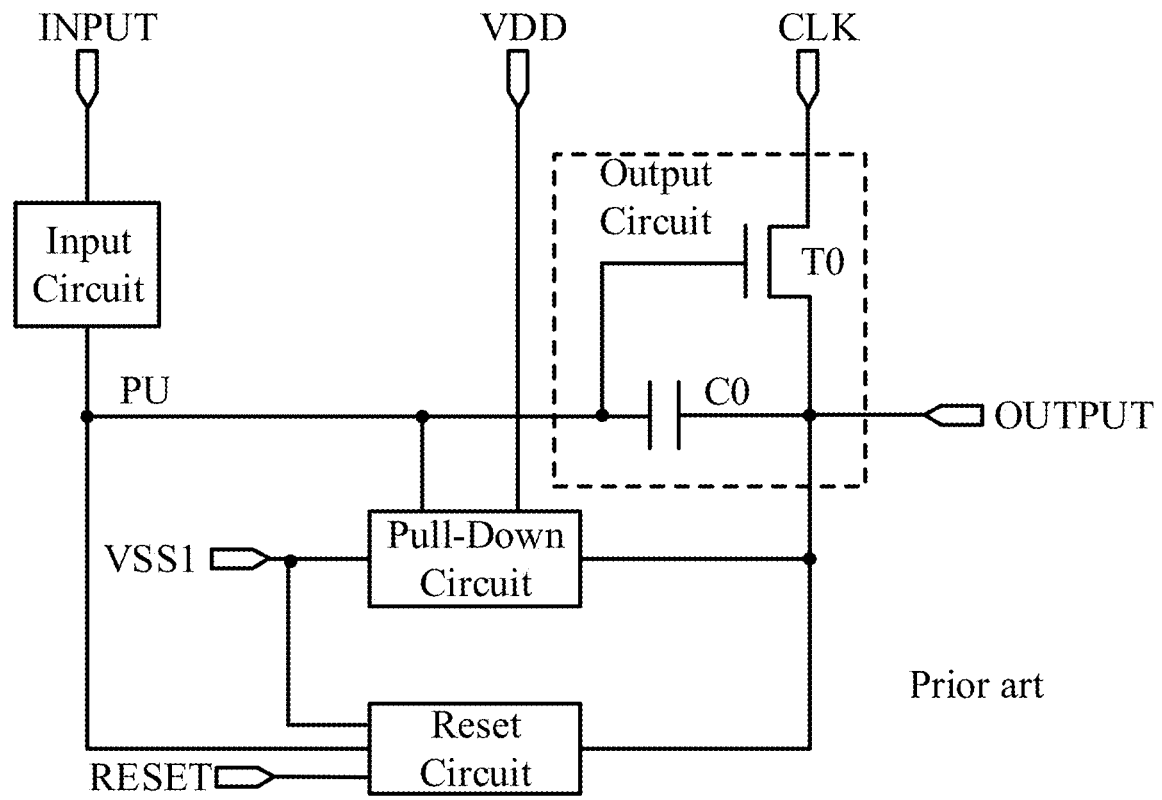
FIG. 1 is a structural schematic diagram of a related shift register circuit.

FIG. 1 is a structural schematic diagram of the related shift register circuit. As shown in FIG. 1, the shift register circuit comprises: an input circuit, an output circuit, a reset circuit, a pull-down circuit, a signal input terminal INPUT, a reset terminal RESET, a first power source terminal VDD, a second power source terminal VSS1, a clock signal terminal CLK, and a signal output terminal OUTPUT. The input circuit connects the signal input terminal INPUT and a first node PU. The output circuit includes a transistor T0 and a capacitor C0, and connects the first node PU, the clock signal terminal CLK and the signal output terminal OUTPUT. The reset circuit connects the reset terminal RESET, the first node PU, the second power source terminal VSS1, and the signal output terminal OUTPUT. The pull-down circuit connects the first node PU, the first power source terminal VDD, the second power source terminal VSS1, and the signal output terminal OUTPUT.

Figure 2:
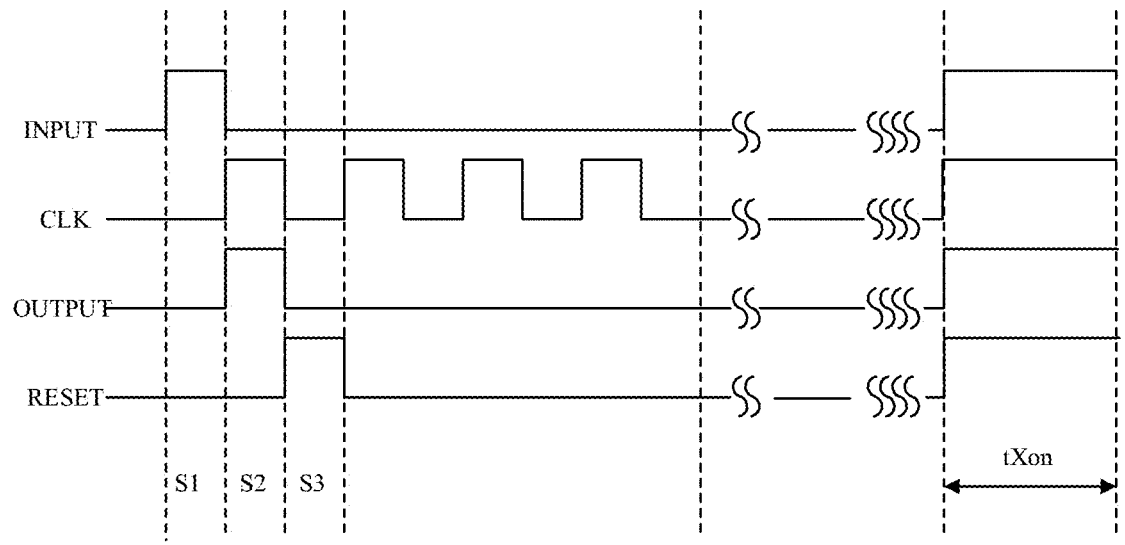
FIG. 2 is an operation timing diagram of a related shift register circuit.

FIG. 2 is an operation timing diagram of the related shift register circuit. As shown in FIG. 2, the timing diagram gives an operation timing diagram within a time of one frame and during an off stage of the display panel (a tXon stage). During a stage S1, the signal input terminal INPUT is a high level, and the first node PU is a high level; the capacitor C0 in the output circuit is charged. During a stage S2, a signal of the clock signal terminal CLK is a high level; under the bootstrap function of the capacitor C0 in the output circuit, a potential of the first node PU is further boosted; a transistor T0 in the output circuit is turned on, and the signal output terminal OUTPUT outputs a signal of the clock signal terminal CLK. During a stage S3, the reset terminal RESET is a high level, and potentials of the first node PU and the signal output terminal OUTPUT are pulled down to a low level of the second power source terminal VSS1. One frame is obtained by scanning all rows, and stages S1, S2 and S3 are repeatedly performed for scanning of each row. The timings of the following N frames operate in a similar way to the preceding first frame. During an off stage of the display panel, this time period is defined as tXon. Input signals of the signal input terminal INPUT, the clock signal terminal CLK, the reset terminal RESET, and the second power source terminal VSS1 are all a high level. At this time, a signal outputted from the signal output terminal OUTPUT of the shift register circuit is a high level. Therefore, all the row outputs of the GOA circuit are a high level, so at this time, all the pixels are turned on. A preset voltage may be written into the pixel, such that the screen is displayed as all block or all write, achieving an off screen of the display panel.

However, the inventor of the present application has found that, for the related GOA circuit, during an off stage of the display panel, all the first nodes PU in the GOA circuit are a high level, which renders the transistor T0 in the output circuit of each of the shift register circuits in a high level bias state for a long time and a transistor of the corresponding display area in a high level bias state. In this way, if frequently perform an on/off operation for the display panel is frequently performed, the transistor in the output circuit and the transistor of the corresponding display area in the shift register circuit will be in a high level state for a long time, which will result in a display exception of the display panel and reduce the operation stability and service life of the display panel.

For this reason, an improved shift register circuit is provided according to some embodiments of the present disclosure.

Those skilled in the art may understand that, the transistor used in all the embodiments of the present application may be a thin film transistor, a field effect transistor, or other device having the same properties. According to some embodiments of the present disclosure, the thin film transistor used may be an oxide semiconductor transistor. Since the transistor used herein have symmetrical source and drain, its source and drain are mutually replaceable. In some embodiments of the present disclosure, to distinguish the two electrodes other than the gate of the transistor, one electrode is referred to as a first electrode, and the other electrode is referred to as a second electrode, wherein the first electrode may be a source or drain, and the second electrode may be a drain or source.

Figure 3:
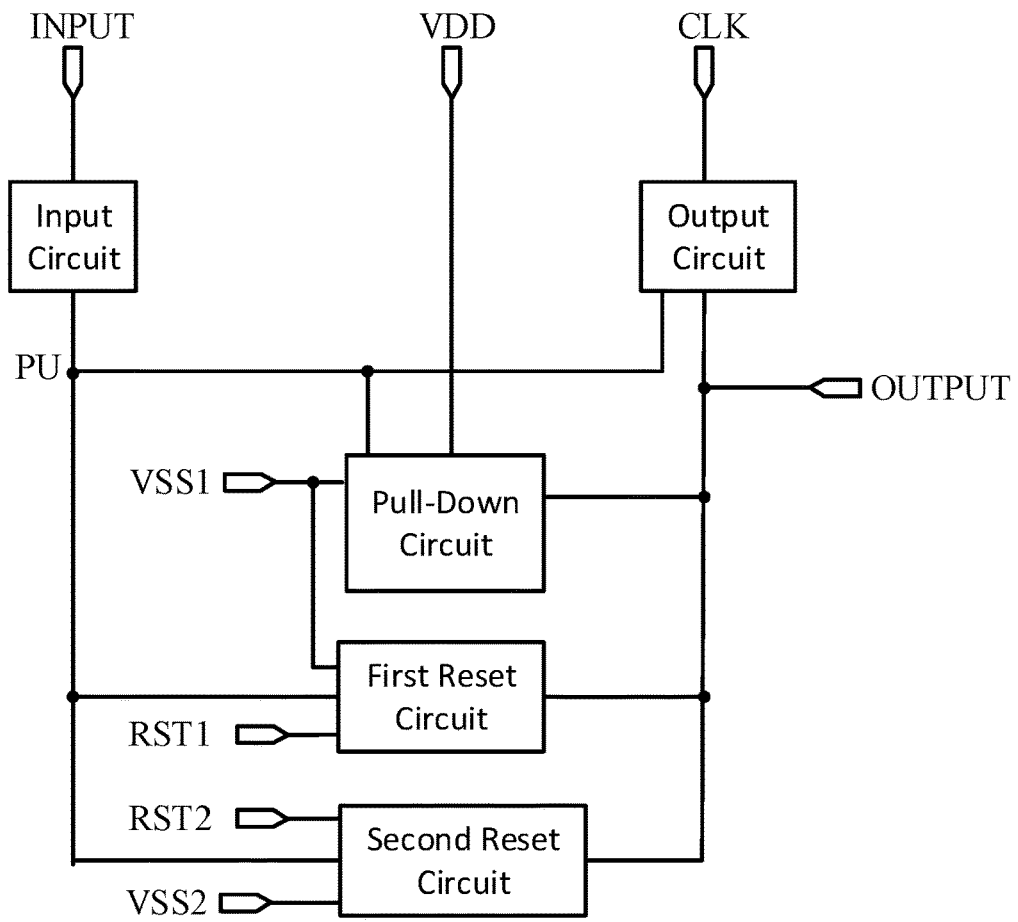
FIG. 3 is a structural schematic diagram of a shift register circuit provided according to some embodiments of the present disclosure.

FIG. 3 is a structural schematic diagram of the shift register circuit provided according to some embodiments of the present disclosure. As shown in FIG. 3, the shift register circuit provided according to some embodiments of the present disclosure is arranged in a display panel, and comprises: an input circuit, an output circuit, a pull-down circuit, a first reset circuit, and a second reset circuit.

In some embodiments, the input circuit is connected to a signal input terminal INPUT and a first node PU, and is configured to provide a signal of the signal input terminal INPUT to the first node PU, under the control of the signal input terminal INPUT.

The output circuit is connected to a clock signal terminal CLK, the first node PU, and a signal output terminal OUTPUT, and is configured to provide a signal of the clock signal terminal CLK to the signal output terminal OUTPUT under the control of the first node PU.

The pull-down circuit is connected to the first node PU, a first power source terminal VDD, a second power source terminal VSS1, and the signal output terminal OUTPUT, and is configured to provide a signal of the second power source terminal VSS1 to the first node PU and the signal output terminal OUTPUT, under the control of the first power source terminal VDD.

The first reset circuit is connected to a first reset terminal RST1, the second power source terminal VSS1, the first node PU, and the signal output terminal OUTPUT, and configured to provide a signal of the second power source terminal VSS1 to the first node PU and the signal output terminal OUTPUT, under the control of the first reset terminal RST1.

The second reset circuit is connected to a second reset terminal RST2, a third power source terminal VSS2, the first node PU, and the signal output terminal OUTPUT, and configured to provide a signal of the third power source terminal VSS2 to the first node PU and the input output terminal OUTPUT under the control of the second reset terminal RTS2. In some embodiments, the second reset circuit is further configured to provide the signal of the third power source terminal VSS2 to the first node PU and the input output terminal OUTPUT under the control of the second reset terminal RTS2 during on and off stages of the display panel.

It needs to be understood that, the first power source terminal VDD continuously provides a high level signal, and the second power source terminal VSS1 and the third power source terminal VSS2 continuously provide a low level signal. A potential of the low level signal provided by the second power source terminal VSS1 is typically a potential to turn off the transistor, for example, −8 V, and a potential of the low level signal provided by the third power source terminal VSS2 is typically a potential to reset a gate voltage of the transistor, for example, 0 V. In other words, the potential of the signal of the second power source terminal VSS1 is less than the potential of the signal of the third power source terminal VSS2. An input signal of the signal input terminal INPUT is a pulse signal, which is a high level only during an input stage; an output signal of the signal output terminal OUTPUT is a pulse signal, which is a high level only during an output stage; an input signal of the first reset terminal RST1 is a pulse signal, which is a high level only during a reset stage; an input signal of the second reset terminal RST2 is a pulse signal, which is a high level only during on and off stages of the display panel.

In some embodiments, the second reset circuit provides a signal of the third power source terminal VSS2 to the first node PU and the signal output terminal OUTPUT during an on stage of the display panel, which can avoid a display exception of the display panel caused by the first node PU in the shift register circuit being a high level all the time.

The shift register circuit provided according to some embodiments of the present disclosure comprises: an input circuit configured to provide a signal of the signal input terminal to the first node under the control of the signal input terminal; an output circuit configured to provide a signal of the clock signal terminal to the signal output terminal under the control of the first node; a pull-down circuit configured to provide a signal of the second power source terminal to the first node and the signal output terminal under the control of the first power source terminal; a first reset circuit configured to provide a signal of the second power source terminal to the first node and the signal output terminal under the control of the first reset terminal; and a second reset circuit configured to provide a signal of the third power source terminal to the first node and the signal output terminal under the control of the second reset terminal, for example during on and off stages of the display panel. The shift register circuit provided by the present disclosure performs a reset operation for the first node and the signal output terminal by the second reset circuit during an off stage of the display panel, which effectively reduces a high level bias time of the transistor in the output circuit and a high level bias time of the gate of the transistor in the display area from one on/off operation to another on/off operation of the display panel, ensures a normal display of the display panel, and enhances the service life and operation stability of the display panel.

Figure 4:
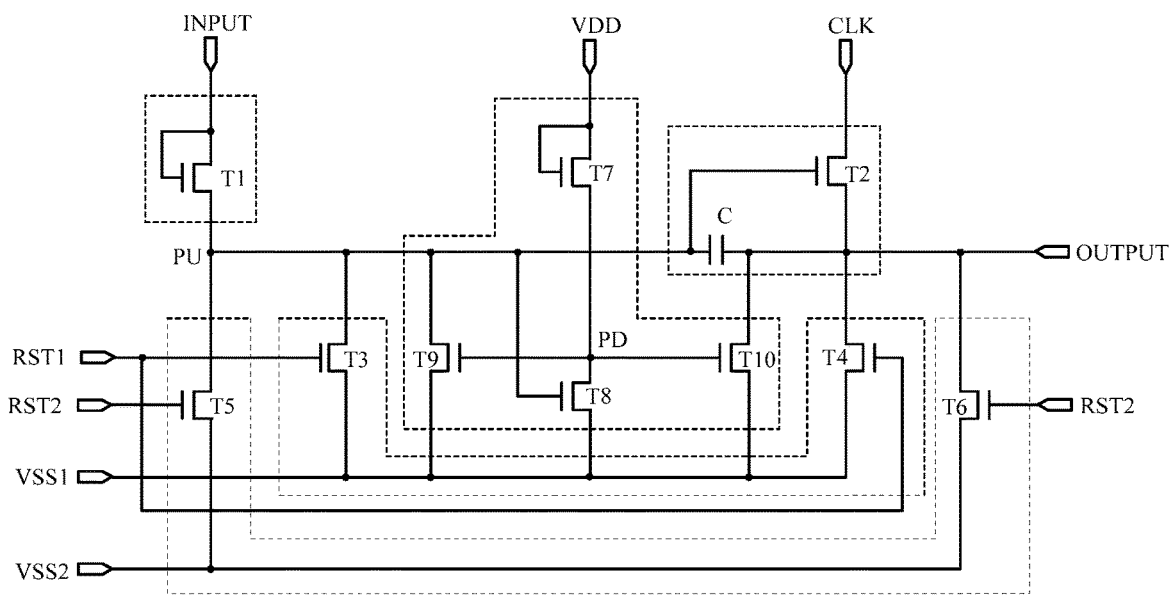
FIG. 4 is an example equivalent circuit diagram of a shift register circuit provided according to some embodiments of the present disclosure.

FIG. 4 is an example equivalent circuit diagram of the shift register circuit provided according to some embodiments of the present disclosure. As shown in FIG. 4, the shift register circuit comprises an input circuit, an output circuit, a pull-down circuit, a first reset circuit, and a second reset circuit. Those skilled in the art readily conceive that, implementations of the aforementioned various circuits are not limited to this, as long as their respective functions can be achieved.

The input circuit includes a first transistor T1. Of the first transistor T1, a gate and a first electrode are connected to a signal input terminal INPUT, and a second electrode is connected to a first node PU.

The output circuit includes a second transistor T2 and a capacitor C. Of the second transistor T2, a gate is connected to the first node PU, a first electrode is connected to a clock signal terminal CLK, and a second electrode is connected to a signal output terminal OUTPUT. Of the capacitor C, one terminal is connected to the first node PU, and the other terminal is connected to the signal output terminal OUTPUT.

The first reset circuit includes a third transistor T3 and a fourth transistor T4. Of the third transistor T3, a gate is connected to a first reset terminal RST1, a first electrode is connected to the first node PU, and a second electrode is connected to a second power source terminal VSS1. Of the fourth transistor T4, a gate is connected to the first reset terminal RST1, a first electrode is connected to the signal output terminal OUTPUT, and a second electrode is connected to the second power source terminal VSS1.

The second reset circuit includes a fifth transistor T5 and a sixth transistor T6. Of the fifth transistor T5, a gate is connected to the second reset terminal RST2, a first electrode is connected to the first node PU, and a second electrode is connected to the third power source terminal VSS2. Of the sixth transistor T6, a gate is connected to the second reset terminal RST2, a first electrode is connected to the signal output terminal OUTPUT, and a second electrode is connected to the third power source terminal VSS2.

The pull-down circuit includes a seventh transistor T7, an eighth transistor T8, a ninth transistor T9, and a tenth transistor T10. Of the seventh transistor T7, a gate and a first electrode are connected to the first power source terminal VDD, and a second electrode is connected to a second node PD. Of the eighth transistor T8, a gate is connected to the first node PU, a first electrode is connected to the second node PD, and a second electrode is connected to the second power source terminal VSS1. Of the ninth transistor T9, a gate is connected to the second node PD, a first electrode is connected to the first node PU, and a second electrode is connected to the second power source terminal VSS1. Of the tenth transistor T10, a gate is connected to the second node PD, a first electrode is connected to the signal output terminal OUTPUT, and a second electrode is connected to the second power source terminal VSS1.

In these embodiments, each of the transistors T1 to T10 may be an N-type thin film transistor or a P-type thin film transistor, which may unify the process flow, can reduce process procedures and facilitate the improvement of the product yield. In addition, considering that the polysilicon thin film transistor has a low drain current at a low temperature, according to some embodiments of the present disclosure, each of the transistors is a low-temperature polysilicon thin film transistor, and the thin film transistor may be selected as a thin film transistor having a bottom gate structure or a thin film transistor having a top gate structure, as long as the on/off function can be achieved.

It needs to be noted that, the capacitor C may be a liquid crystal capacitor composed of a pixel electrode and a common electrode, or an equivalent capacitor composed of a storage capacitor and the liquid crystal capacitor composed of the pixel electrode and the common electrode. The present disclosure makes no limit thereto.

A technical solution according to some embodiments of the present disclosure is further explained using an operation process of the shift register circuit.

Figure 5:
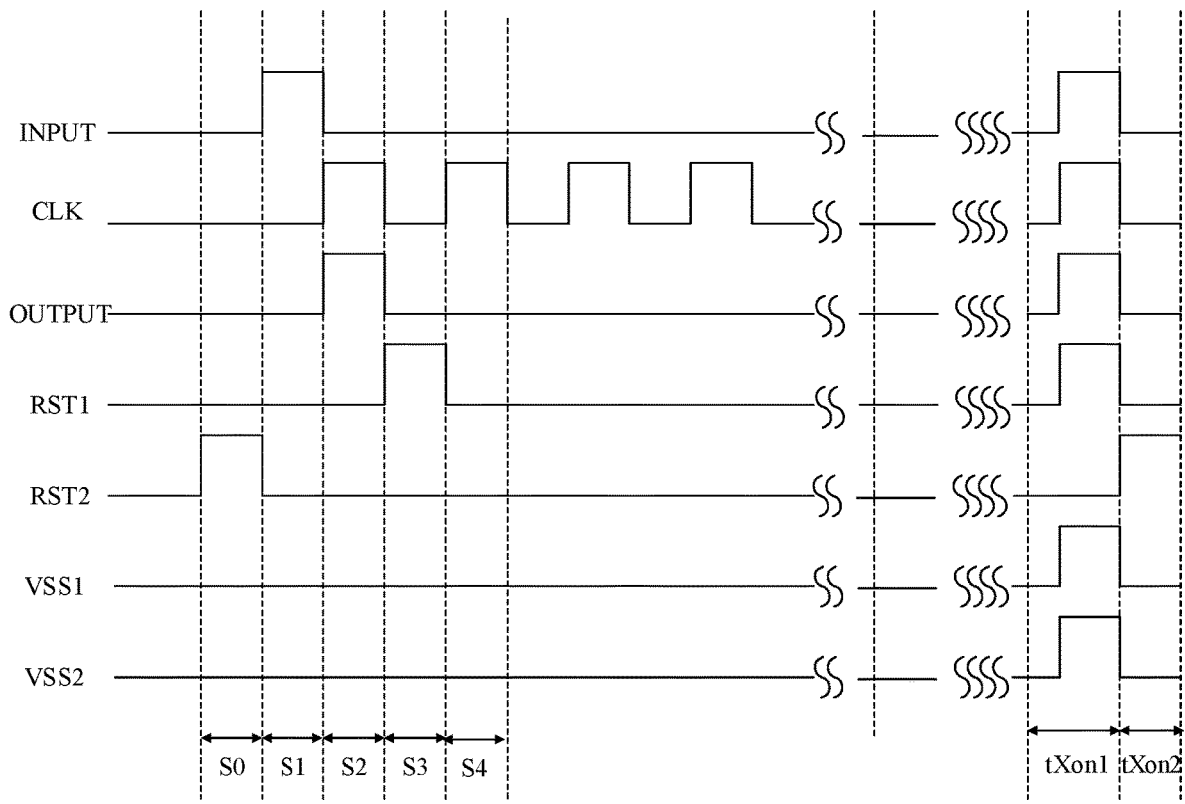
FIG. 5 is an operation timing diagram of a shift register circuit provided according to some embodiments of the present disclosure.

FIG. 5 is an operation timing diagram of the shift register circuit provided according to some embodiments of the present disclosure. As shown in FIG. 4, the shift register circuit provided according to some embodiments of the present disclosure may comprise ten transistors (T1 to T10), one capacitor circuit (C), four input terminals (INPUT, RST1, RST2 and CLK), one output terminal (OUTPUT), and three power source terminals (VDD, VSS1 and VSS2). As shown in FIG. 5, the operation process of the shift register may comprise the following.

During an on stage S0 of the display panel, an input signal of the second reset terminal RST2 is a high level, the fifth transistor T5 and the sixth transistor T6 are turned on, and potentials of the first node PU and the signal output terminal OUTPUT are pulled down to a low level of the third power source terminal VSS2.

During this stage, an input signal of the second reset terminal RST2 in the input terminal is a high level; input signals of the signal input terminal INPUT, the first reset terminal RST1 and the clock signal terminal CLK are a low level; an output signal of the signal output terminal OUTPUT is a low level; the first power source terminal VDD is a high level; the second power source VSS1 and the third power source terminal VSS2 are a low level.

During the first stage S1, i.e. an input stage, an input signal of the signal input terminal INPUT is a high level; the first transistor T1 is turned on; a potential of the first node PU is pulled up; the capacitor C is charged. Since the potential of the first node PU is pulled up, the eighth transistor T8 is turned on, and a potential of the second node PD is pulled down to the low level of the second power source terminal VSS1.

During this stage, an input signal of the signal input terminal INPUT is a high level; input signals of the first reset terminal RST1, the second reset terminal RST2, and the clock signal terminal CLK are all a low level; an output signal of the signal output terminal OUT is a low level; the first power source terminal VDD is a high level; the second power source terminal VSS1 and the third power source terminal VSS2 are a low level. Since the potential of the second node PD is a low level, the ninth transistor T9 and the tenth transistor T10 are off all the time, and the potential of the first node PU is not pulled down.

During a second stage S2, i.e. an output stage, an input signal of the signal input terminal INPUT is a low level; the first transistor T1 is turned off; the first node PU continues to keep a high level; the second node PD continues to keep a low level. An input signal of the clock signal CLK becomes a high level. Due to the bootstrap effect of the capacitor C, the potential of the first node PU continues to be pulled up, and a high level of the first node PU causes the second transistor T2 to be turned on. The signal output terminal OUTPUT outputs a signal of the clock signal terminal CLK, i.e. a gate drive signal. In addition, a boost in the potential of the first node PU enhances the charging capability of the second transistor T2 and ensures the pixel to be charged.

During this stage, an input signal of the clock signal terminal CLK in the input terminals is a high level; input signals of the signal input terminal INPUT, the first reset terminal RST1, and the second reset terminal RST2 are all a low level; an output signal of the signal output terminal OUT is a high level; the first power source terminal VDD is a high level; the second power source terminal VSS1 and the third power source terminal VSS2 are a low level. Since the first node PU is still a high level, the eighth transistor T8 keeps on, and thus the second node PU is still a low level.

During a third stage S3, i.e. a reset stage, an input signal of the first reset terminal RST1 is a high level, and the third transistor T3 and the fourth transistor T4 are turned on. The third transistor T3 is turned on to discharge the first node PU, and pull down a potential of the first node PU to the low level of the second power source terminal VSS1, while causing the second transistor T2 to be turned off, reducing noise of the signal output terminal OUTPUT, and causing the eighth transistor T8 to be turned off. The fourth transistor T4 is turned on to discharge the signal output terminal OUTPUT, and pull down the potential of the signal output terminal OUTPUT to the low level of the second power source terminal VSS1. Since the eighth transistor T8 is turned off, the first power source terminal VDD is a high level. At this time, the first power source terminal VDD pulls up the potential of the second node PD, and the ninth transistor T9 and the tenth transistor T10 are turned on, and the potentials of the first node PU and the signal output terminal OUTPUT are further pulled down.

During this stage, an input signal of the first reset terminal RST1 in the input terminals is a high level; input signals of the clock signal terminal CLK, the signal input terminal INPUT and the second reset terminal RST2 are a low level; an output signal of the signal output terminal OUTPUT is a low level; the first power source terminal VDD is a high level; the second power source terminal VSS1 and the third power source terminal VSS2 are a low level.

In some embodiments, the first reset terminal RST1 is connected to a signal output terminal OUTPUT of a next stage of shift register circuit, and a high level signal of the first reset terminal RST1 is a high level outputted by the signal output terminal OUTPUT of the next stage of shift register circuit.

During a fourth stage S4, an input signal of the clock signal terminal CLK is a high level. Since the second transistor T2 is in an off state at this time, a high level of the clock signal terminal CLK cannot be outputted to the signal output terminal OUTPUT; the signal output terminal OUTPUT keeps the low level output of the previous stage; the second node PD is continuously a high level; the ninth transistor T9 is turned on; the potential of the first node PU is continuously pulled down to the second power source terminal VSS1, such that noise can be avoided. The tenth transistor T10 is turned on, and the potential of the signal output terminal OUTPUT is continuously pulled down to the second power source terminal VSS1, such that noise can be avoided.

During this stage, an input signal of the clock signal terminal CLK is a high level; input signals of the signal input terminal INPUT, the first reset terminal RST1, and the second reset terminal RST2 are all a low level; the signal output terminal OUTPUT is a low level; the first power source terminal VDD is a high level; the second power source terminal VSS1 and the third power source terminal VSS2 are a low level.

During an off stage of the display panel, the off stage of the display panel is divided into two stages, namely a first off stage tXon1 and a second off stage tXon2.

During the first off stage tXon1, the signal input terminal INPUT, the clock signal terminal CLK, the first reset terminal RST1, the second power source terminal VSS1, and the third power source terminal VSS2 are a high level; the first transistor T1, the second transistor T2, the third transistor T3, the fourth transistor T4, the seventh transistor T7, the eighth transistor T8, the ninth transistor T9, and the tenth transistor T10 are all turned on; an output signal of the signal output terminal OUTPUT is a high level.

During this stage, input signals of the signal input terminal INPUT, the clock signal terminal CLK, and the first reset terminal RST1 are a high level; an input signal of the second reset terminal RST2 is a low level; an output signal of the signal output terminal OUTPUT is a high level; the first power source terminal VDD, the second power source terminal VSS1, and the third power source VSS2 are a high level.

During the second off stage tXon2, the signal input terminal INPUT, the clock signal terminal CLK, the first reset terminal RST1, the second power source terminal VSS1, and the third power source terminal VSS2 are a low level; an input signal of the second reset terminal RST2 is a high level; the fifth transistor T5 and the sixth transistor T6 are turned on; the potentials of the first node PU and the signal output terminal OUTPUT are pulled down to the low level of the third power source terminal VSS2.

During this stage, input signals of the signal input terminal INPUT, the clock signal terminal CLK, and the first reset terminal RST1 are a low level; an input signal of the second reset terminal RST2 is a high level; an output signal of the signal output terminal OUTPUT is a low level; the first power source terminal VDD is a high level; the second power source terminal VSS1 and the third power source terminal VSS2 are a low level.

According to some embodiments of the present disclosure, potentials of the first node and the signal output terminal are pulled down by the second reset terminal during the off stage of the display panel, which effectively reduces a high level bias time of the transistor in the output circuit and a high level bias time of a gate of the transistor in the display area between one on/off operation to another on/off operation of the display panel, ensures a normal display of the display panel, and improves the service life and operation stability of the display panel.

Based on inventive concepts of the aforementioned embodiments, the shift register circuit provided according to some embodiments of the present disclosure is arranged in the display panel, comprising: an input circuit, an output circuit, a pull-down circuit, a first reset circuit, and a second reset circuit.

In some embodiments, the input circuit is connected to the signal input terminal INPUT and the first node PU, and is configured to provide a signal of the signal input terminal INPUT to the first node PU under the control of the signal input terminal INPUT. The output circuit is connected to the clock signal terminal CLK, the first node PU, and the signal output terminal OUTPUT, and is configured to provide a signal of the clock signal terminal CLK to the signal output terminal OUTPUT under the control of the first node PU.

The pull-down circuit is connected to the first node PU, the first power source terminal VDD, the second power source terminal VSS1, and the signal output terminal OUTPUT, and is configured to provide a signal of the second power source terminal VSS1 to the first node PU and the signal output terminal OUTPUT under the control of the first power source terminal VDD.

The first reset circuit is connected to the first reset terminal RST1, the second power source terminal VSS1, the first node PU, and the signal output terminal OUTPUT, and is configured to provide a signal of the second power source terminal VSS1 to the first node PU and the signal output terminal OUTPUT under the control of the first reset terminal RST1.

The second reset circuit is connected to the second reset terminal RST2, the third power source terminal VSS2, the first node PU, and the signal output terminal OUTPUT, and is configured to provide a signal of the third power source terminal VSS2 to the first node PU and the signal output terminal OUTPUT under the control the second reset terminal RST2. In some embodiments, the second reset circuit is further configured to provide a signal of the third power source terminal VSS2 to the first node PU and the signal output terminal OUTPUT under the control the second reset terminal RST2 during the on and off stages of the display panel.

It needs to be understood that, the first power source terminal VDD continuously provides a high level signal, and the second power source terminal VSS1 and the third power source terminal VSS2 continuously provide a low level signal. A potential of the low level signal provided by the second power source terminal VSS1 is a potential to turn off the transistor, for example, −8 V, and a potential of the low level signal provided by the third power source terminal VSS2 is a potential to reset a gate voltage of the transistor, for example, 0 V. In other words, the potential of the signal of the second power source terminal VSS1 is less than the potential of the signal of the third power source terminal VSS2.

In some embodiments, the second reset circuit provides a signal of the third power source terminal VSS2 to the first node PU and the signal output terminal OUTPUT during an on stage of the display panel, which can avoid a display exception of the display panel caused by the first node PU in the shift register circuit being a high level all the time.

The shift register circuit provided according to some embodiments of the present disclosure comprises: an input circuit configured to provide a signal of the signal input terminal to the first node under the control of the signal input terminal, an output circuit configured to provide a signal of the clock signal terminal to the signal output terminal under the control of the first node, a pull-down circuit configured to provide a signal of the second power source terminal to the first node and the signal output terminal under the control of the first power source terminal, a first reset circuit configured to provide a signal of the second power source terminal to the first node and the signal output terminal under the control of the first reset terminal, and a second reset circuit configured to provide a signal of the third power source terminal to the first node and the signal output terminal under the control of the second reset terminal, for example during on and off stages of the display panel. The shift register circuit provided by the present disclosure performs a reset operation for the first node and the signal output terminal by the second reset circuit during the off stage of the display panel, which effectively reduces a high level bias time of the transistor in the output circuit and a high level bias time of the gate of the transistor in the display area from one on/off operation to another on/off operation of the display panel, ensures a normal display of the display panel, and enhances the service life and operation stability of the display panel.

Figure 6:
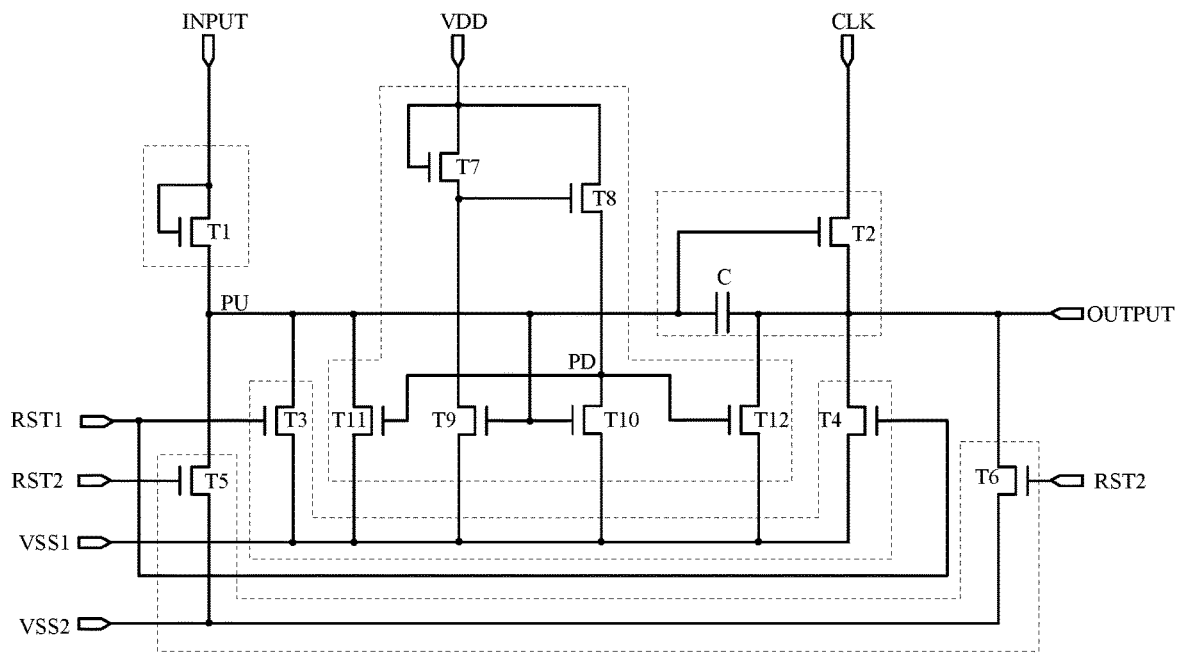
FIG. 6 is another equivalent circuit diagram of a shift register circuit provided according to some embodiments of the present disclosure.

FIG. 6 is another equivalent circuit diagram of the shift register circuit provided according to some embodiments of the present disclosure. FIG. 6 shows an example structure of an input circuit, an output circuit, a pull-down circuit, a first reset circuit, and a second reset circuit. Those skilled in the art easily understand that, implementations of the above various circuits are not limited to this, as long as their respective functions can be achieved.

The input circuit includes a first transistor T1. Of the first transistor T1, a gate and a first electrode are connected to a signal input terminal INPUT, and a second electrode is connected to the first node PU.

The output circuit includes a second transistor T2 and a capacitor C. Of the second transistor T2, a gate is connected to the first node PU, a first electrode is connected to a clock signal terminal CLK, and a second electrode is connected to a signal output terminal OUTPUT. Of the capacitor C, one terminal is connected to the first node PU, and the other terminal is connected to the signal output terminal OUTPUT.

The first reset circuit includes a third transistor T3 and a fourth transistor T4. Of the third transistor T3, a gate is connected to a first reset terminal RST1, a first electrode is connected to the first node PU, and a second electrode is connected to a second power source terminal VSS1. Of the fourth transistor T4, a gate is connected to the first reset terminal RST1, a first electrode is connected to the signal output terminal OUTPUT, and a second electrode is connected to the second power source terminal VSS1.

The second reset circuit includes a fifth transistor T5 and a sixth transistor T6. Of the fifth transistor T5, a gate is connected to the second reset terminal RST2, a first electrode is connected to the first node PU, and a second electrode is connected to the third power source terminal VSS2. Of the sixth transistor T6, a gate is connected to the second reset terminal RST2, a first electrode is connected to the signal output terminal OUTPUT, and a second electrode is connected to the third power source terminal VSS2.

The pull-down circuit includes a seventh transistor T7, an eighth transistor T8, a ninth transistor T9, a tenth transistor T10, an eleventh transistor T11, and twelfth transistor T12. Of the seventh transistor T7, a gate and a first electrode are connected to the first power source terminal VDD, and a second electrode is connected to a third node PD_CN. Of the eighth transistor T8, a gate is connected to the third node PD_CN, a first electrode is connected to the first power source terminal VDD, and a second electrode is connected to the second node PD. Of the ninth transistor T9, a gate is connected to the first node PU, a first electrode is connected to the third node PD_CN, and a second electrode is connected to the second power source terminal VSS1. Of the tenth transistor T10, a gate is connected to the first node PU, a first electrode is connected to the second node PD, and a second electrode is connected to the second power source terminal VSS1. Of the eleventh transistor T11, a gate is connected to the second node PD, a first electrode is connected to the first node PU, and a second electrode is connected to the second power source terminal VSS1. Of the twelfth transistor T12, a gate is connected to the second node PD, a first electrode is connected to the signal output terminal OUTPUT, and a second electrode is connected to the second power source terminal VSS1.

In this embodiment, each of the transistors T1 to T12 may be an N-type thin film transistor or a P-type thin film transistor, which may unify the process flow, can reduce process procedures and facilitate the improvement of the product yield. In addition, considering that the polysilicon thin film transistor has a low drain current at a low temperature, according to some embodiments of the present disclosure, each of the transistors is a low-temperature polysilicon thin film transistor, and the thin film transistor may be selected as a thin film transistor having a bottom gate structure or a thin film transistor having a top gate structure, as long as the on/off function can be achieved.

It needs to be noted that, the capacitor C may be a liquid crystal capacitor composed of a pixel electrode and a common electrode, or an equivalent capacitor composed of a storage capacitor and the liquid crystal capacitor composed of the pixel electrode and the common electrode. The present disclosure makes no limit thereto.

A technical solution according to some embodiments of the present disclosure is further explained using an operation procedure of the shift register circuit.

As shown in FIG. 6, the shift register circuit provided according to some embodiments of the present disclosure may comprise twelve transistor circuits (T1 to T12), one capacitor circuit (C), four input terminals (INPUT, RST1, RST2, and CLK), one output terminal (OUTPUT), and three power source terminals (VDD, VSS1, and VSS2). As shown in FIG. 5, an operation process of the shift register circuit comprises the following.

During an on stage S0 of the display panel, an input signal of the second reset terminal RST2 is a high level; the fifth transistor T5 and the sixth transistor T6 are turned on; potentials of the first node PU and the signal output terminal OUTPUT are pulled down to a low level of the third power source terminal VSS2.

During this stage, an input signal of the second reset terminal RST2 is a high level; input signals of the signal input terminal INPUT, the first reset terminal RST1 and the clock signal terminal CLK are a low level; an input signal of the signal output terminal OUTPUT is a low level; the first power source terminal VDD is a high level; the second power source VSS1 and the third power source terminal VSS2 are a low level.

During the first stage S1, i.e. an input stage, an input signal of the signal input terminal INPUT is a high level; the first transistor T1 is turned on; a potential of the first node PU is pulled up; the capacitor C is charged. Since the potential of the first node PU is pulled up, the ninth transistor T9 and the tenth transistor T10 keep on, and a potential of the second node PD is pulled down to the low level of the second power source terminal VSS1.

During this stage, an input signal of the signal input terminal INPUT is a high level; input signals of the first reset terminal RST1, the second reset terminal RST2, and the clock signal terminal CLK are all a low level; an output signal of the signal output terminal OUT is a low level; the first power source terminal VDD is a high level; the second power source terminal VSS1 and the third power source terminal VSS2 are a low level. Since the potential of the second node PD is a low level, the eleventh transistor T11 and the twelfth transistor T12 are off all the time, and the potential of the first node PU is not pulled down.

During a second stage S2, i.e. an output stage, an input signal of the signal input terminal INPUT is a low level; the first transistor T1 is turned off; the first node PU continues to keep a high level, and the second node PD continues to keep a low level. An input signal of the clock signal CLK becomes a high level. Due to the bootstrap effect of the capacitor C, the potential of the first node PU continues to be pulled up; a high level of the first node PU causes the second transistor T2 to be turned on; the signal output terminal OUTPUT outputs a signal of the clock signal terminal CLK, i.e. a gate drive signal. In addition, a boost in the potential of the first node PU enhances the charging capability of the second transistor T2 and ensures the pixel to be charged.

During this stage, an input signal of the clock signal terminal CLK is a high level; input signals of the signal input terminal INPUT, the first reset terminal RST1, and the second reset terminal RST2 are a low level; an output signal of the signal output terminal OUT is a high level; the first power source terminal VDD is a high level; the second power source terminal VSS1 and the third power source terminal VSS2 are a low level. Since the first node PU is still a high level, the ninth transistor T9 and the tenth transistor T10 keep on, and thus the second node PU is still a low level.

During a third stage S3, i.e. a reset stage, an input signal of the first reset terminal RST1 is a high level, and the third transistor T3 and the fourth transistor T4 are turned on. The third transistor T3 is turned on to discharge the first node PU and pull down a potential of the first node PU to the low level of the second power source terminal VSS1, while causing the second transistor T2 to be turned off, reducing noise of the signal output terminal OUTPUT, and further causing the ninth transistor T9 and the tenth transistor T10 to be turned off. The fourth transistor T4 is turned on to discharge the signal output terminal OUTPUT, and pull down the potential of the signal output terminal OUTPUT to the low level of the second power source terminal VSS1. Since the ninth transistor T9 and the tenth transistor T10 are turned off, the first power source terminal VDD is a high level, and the seventh transistor T7 and the eighth transistor T8 are turned on. At this time, the potential of the second node PD is pulled down; the eleventh transistor T11 and the twelfth transistor T12 are turned on; the potentials of the first node PU and the signal output terminal OUTPUT are further pulled down.

During this stage, an input signal of the first reset terminal RST1 is a high level; input signals of the clock signal terminal CLK, the signal input terminal INPUT, and the second reset terminal RST2 are a low level; an output signal of the signal output terminal OUTPUT is a low level; the first power source terminal VDD is a high level; the second power source terminal VSS1 and the third power source terminal VSS2 are a low level.

In this embodiment, the first reset terminal RST1 is connected to a signal output terminal OUTPUT of a next stage of shift register circuit, and a high level signal of the first reset terminal RST1 is a high level outputted by the signal output terminal OUTPUT of the next stage of shift register circuit.

During a fourth stage S4, an input signal of the clock signal terminal CLK is a high level. Since the second transistor T2 is in an off state at this time, a high level of the clock signal terminal CLK cannot be outputted to the signal output terminal OUTPUT. The signal output terminal OUTPUT keeps the low level output of the previous stage; the second node PD is continuously a high level; the eleventh transistor T11 keeps on; the potential of the first node PU is continuously pulled down to the second power source terminal VSS1, such that noise can be avoided. The twelfth transistor T12 is turned on, and the potential of the signal output terminal OUTPUT is continuously pulled down to the second power source terminal VSS1, such that noise can be avoided.

During this stage, an input signal of the clock signal terminal CLK is a high level; input signals of the signal input terminal INPUT, the first reset terminal RST1, and the second reset terminal RST2 are all a low level; the signal output terminal OUTPUT is a low level; the first power source terminal VDD is a high level; the second power source terminal VSS1 and the third power source terminal VSS2 are a low level.

During an off stage of the display panel, the off stage of the display panel is divided into two stages, namely a first off stage tXon1 and a second off stage tXon2.

During the first off stage tXon1, the signal input terminal INPUT, the clock signal terminal CLK, the first reset terminal RST1, the second power source terminal VSS1, and the third power source terminal VSS2 are a high level; the first transistor T1, the second transistor T2, the third transistor T3, the fourth transistor T4, the seventh transistor T7, the eighth transistor T8, the ninth transistor T9, the tenth transistor T10, the eleventh transistor T11, and the twelfth transistor T12 are turned on; an output signal of the signal output terminal OUTPUT is a high level.

During this stage, input signals of the signal input terminal INPUT, the clock signal terminal CLK, and the first reset terminal RST1 are a high level; an input signal of the second reset terminal RST2 is a low level; an output signal of the signal output terminal OUTPUT is a high level; the first power source terminal VDD, the second power source terminal VSS1, and the third power source VSS2 are a high level.

During the second off stage tXon2, the signal input terminal INPUT, the clock signal terminal CLK, the first reset terminal RST1, the second power source terminal VSS1, and the third power source terminal VSS2 are a low level; an input signal of the second reset terminal RST2 is a high level; the fifth transistor T5 and the sixth transistor T6 are turned on; the potentials of the first node PU and the signal output terminal OUTPUT are pulled down to the low level of the third power source terminal VSS2.

During this stage, input signals of the signal input terminal INPUT, the clock signal terminal CLK, and the first reset terminal RST1 are a low level; an input signal of the second reset terminal RST2 is a high level; an output signal of the signal output terminal OUTPUT is a low level; the first power source terminal VDD is a high level; the second power source terminal VSS1 and the third power source terminal VSS2 are a low level.

According to some embodiments of the present disclosure, potentials of the first node and the signal output terminal are pulled down by the second reset terminal during the off stage of the display panel, which effectively reduces a high level bias time of the transistor in the output circuit and a high level bias time of a gate of the transistor in the display area between one on/off operation to another on/off operation of the display panel, ensures a normal display of the display panel, and improves the service life and operation stability of the display panel are improved.

Based on inventive concepts of the aforementioned embodiments, FIG. 7 is a flow diagram of the drive method of the shift register circuit provided according to some embodiments of the present disclosure. The shift register circuit comprises: a signal input terminal INPUT, a first reset terminal RST1, a second reset terminal RST2, a clock signal terminal CLK, a first power source terminal VDD, a second power source terminal VSS1, a third power source terminal VSS2, a signal output terminal OUTPUT, an input circuit, an output circuit, a pull-down circuit, a first reset circuit, and a second reset circuit. As shown in FIG. 7, the drive method of the shift register circuit provided according to some embodiments of the present disclosure is applied to the shift register circuit provided above, and comprises the following steps.

Step 100, during an on stage of the display panel, the second reset circuit provides a signal of the third power source terminal to the first node and the signal output terminal under the control of the second reset terminal.

An input signal of the second reset terminal is a pulse signal. In step 100, an input signal of the second reset terminal is a high level, and the second reset circuit pulls down potentials of the first node and the signal output terminal.

In some embodiments, the second reset circuit pulls down potentials of the first node and the signal output terminal OUTPUT during an on stage of the display panel, which can avoid a display exception of the display panel caused by the first node PU in the shift register circuit being a high level all the time.

Step 200, the input circuit provides a signal of the signal input terminal to the first node under the control of the signal input terminal.

An input signal of the signal input terminal is a pulse signal. In step 200, an input signal of the signal input terminal is a high level, and the input circuit pulls up a potential of the first node.

Step 300, the output circuit provides a signal of the clock signal terminal to the signal output terminal under the control of the first node.

Under the bootstrap function of the capacitor, a potential of the first node is further boosted. An input signal of the clock signal terminal is a high level, and an output signal of the signal output terminal is a high level.

Step 400, the first reset circuit provides a signal of the second power source terminal to the first node and the signal output terminal under the control of the first reset terminal.

An input signal of the reset terminal is a pulse signal. In step 400, an input signal of the first reset terminal is a high level, and the reset circuit pulls down potentials of the first node and the signal output terminal to the low level of the second power source terminal.

Step 500, the pull-down circuit provides a signal of the second power source terminal to the first node and the signal output terminal under the control of the first power source terminal.

The first power source terminal continuously provides a high level, and the pull-down circuit pulls down potentials of the first node and the signal output terminal to the low level of the second power source terminal.

Step 600, during an off stage of the display panel, the second reset circuit provides a signal of the third power source terminal to the first node and the signal output terminal under the control of the second reset terminal.

An input signal of the second reset terminal is a pulse signal. In step 600, an input signal of the second reset terminal is a high level, and the second reset circuit pulls down potentials of the first node and the signal output terminal to the low level of the third power source terminal.

The drive method of the shift register circuit provided according to some embodiments of the present disclosure comprises: during the on stage of the display panel, under the control of the second reset terminal, the second reset circuit provides a signal of the third power source terminal to the first node and the signal output terminal; under the control of the signal input terminal, the input circuit provides a signal of the signal input terminal to the first node; under the control of the first node, the output circuit provides a signal of the clock signal terminal to the signal output terminal; under the control of the first reset terminal, the first reset circuit provides a signal of the second power source terminal to the first node and the signal output terminal; under the control of the first power source terminal, the pull-down circuit provides a signal of the second power source terminal to the first node and the signal output terminal; during the off stage of the display panel, under the control of the second reset terminal, the second reset circuit provides a signal of the third power source terminal to the first node and the signal output terminal. The shift register circuit provided by the present disclosure performs a reset operation for the first node and the signal output terminal by the second reset circuit during the off stage of the display panel, which effectively reduces a high level bias time of the transistor in the output circuit and a high level bias time of the gate of the transistor in the display area from one on/off operation to another on/off operation of the display panel, ensures a normal display of the display panel, and enhances the service life and operation stability of the display panel.

Figure 8:
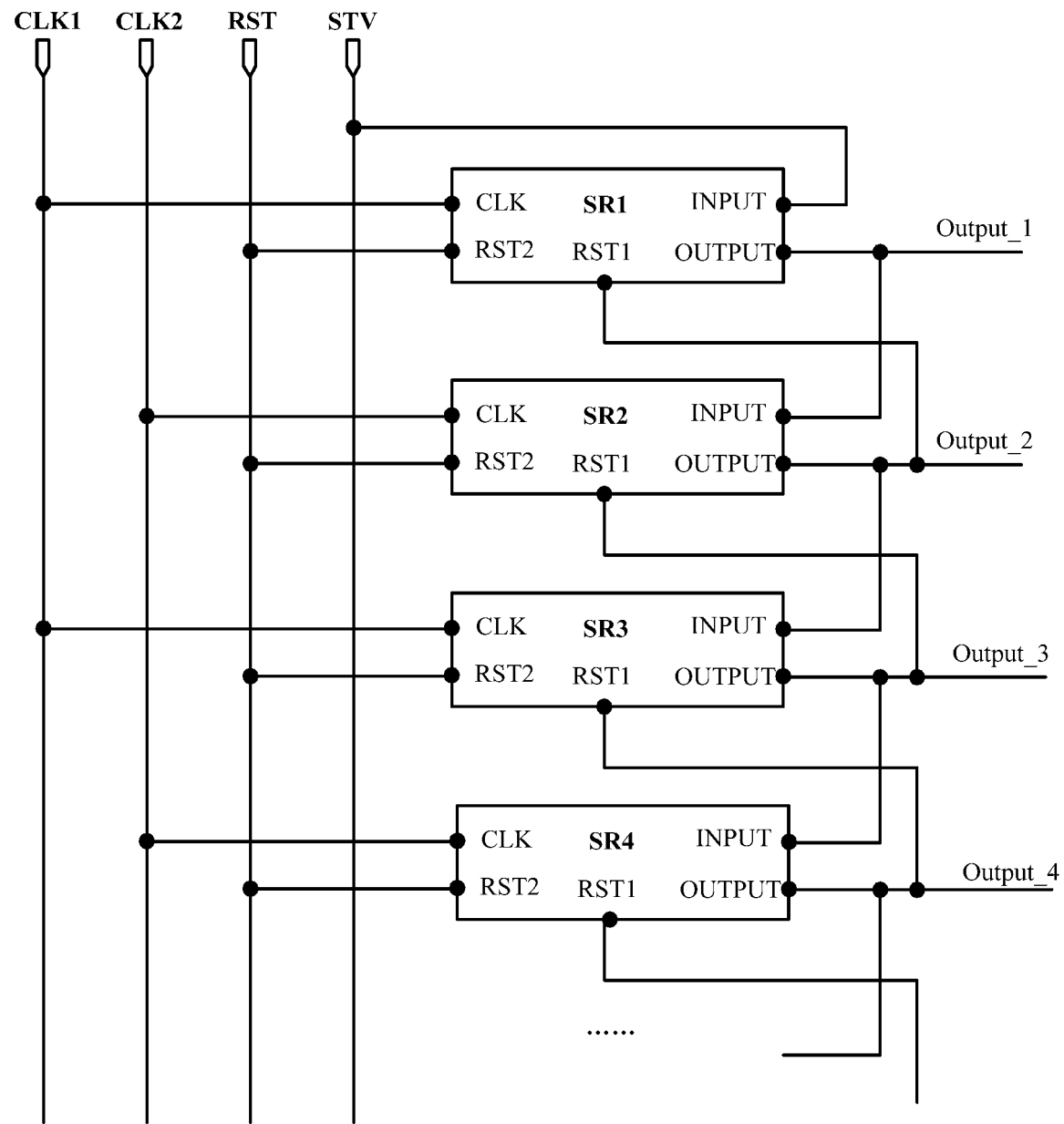
FIG. 8 is a structural schematic diagram of a gate drive circuit provided according to some embodiments of the present disclosure.

Based on inventive concepts of the aforementioned embodiments, FIG. 8 is a structural schematic diagram of the gate drive circuit provided according to some embodiments of the present disclosure. As shown in FIG. 8, according to some embodiments of the present disclosure, a gate drive circuit is provided, comprising: a plurality of cascaded stages of shift register circuits, a reset terminal RST, a first clock signal terminal CLK1, a second clock signal terminal CLK2, and an initial signal input terminal STV.

The shift register circuit is the aforementioned shift register circuits provided according to some embodiments of the present disclosure (for example, the shift register circuits as shown in FIGS. 3, 4 and 6), and has a similar principle and effect for implementation, which are not repeated here.

In some embodiments, a second reset terminal RST2 of each stage of shift register circuit SR is connected to the reset terminal RST. An signal input terminal INPUT of a first stage of the shift register circuit is connected to the initial signal input terminal STV. A signal input terminal INPUT of an Nth stage of the shift register circuit is connected to a signal output terminal OUTPUT of an (N−1)th stage of the shift register circuit. A signal output terminal OUTPUT of the Nth stage of the shift register circuit is connected to a first reset terminal RST1 of the (N−1)th stage of the shift register circuit. N is a positive integer greater than or equal to 2.

In these embodiment, a clock signal terminal CLK of an odd-numbered stage of the shift register circuit is connected to the first clock signal terminal CLK1, and a clock signal terminal CLK of an even-numbered stage of the shift register circuit is connected to the second clock signal terminal CLK2. It needs to be understood that, a signal of the first clock signal terminal CLK1 is an inverted signal of a signal of the second clock signal terminal CLK2.

It should be noted that, FIG. 8 includes a first stage of shift register circuit SR1, a second stage of shift register circuit SR2, a third stage of shift register circuit SR3, and a fourth stage of shift register circuit SR4. Of the first stage of shift register circuit SR1, a signal input terminal INPUT is connected to the initial signal input terminal STV, a first reset terminal RST1 is connected to a signal output terminal OUTPUT of the second stage of shift register circuit SR2, a second reset terminal RST2 is connected to the reset terminal RST, a clock signal terminal CLK is connected to the first clock signal terminal CLK1, and a signal output terminal OUTPUT outputs Output_1. Of the second stage of shift register circuits SR2, a signal input terminal INPUT is connected to the signal output terminal OUTPUT of the first stage of shift register circuit SR1, a first reset terminal RST1 is connected to a signal output terminal OUTPUT of the third stage of shift register circuit SR3, a second reset terminal RST2 is connected to the reset terminal RST, a clock signal terminal CLK is connected to the second clock signal terminal CLK2, and a signal output terminal OUTPUT outputs Output_2. Connection relations and outputs of the respective terminals in the third stage of shift register circuit SR3 and the fourth stage of shift register circuit SR4 are in a similar fashion.

Figure 9:
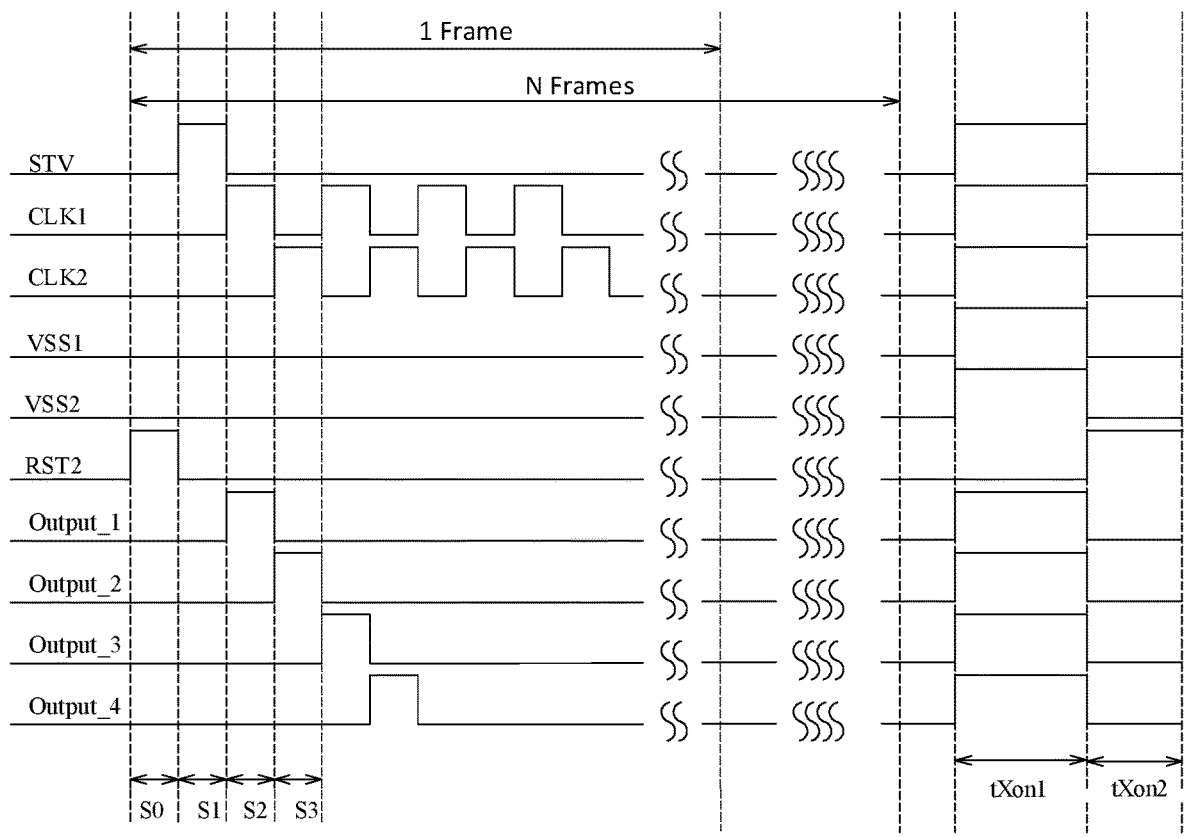
FIG. 9 is an operation timing diagram of a gate drive circuit provided according to some embodiments of the present disclosure.

FIG. 9 is an operation timing diagram of the gate drive circuit provided according to some embodiments of the present disclosure. As shown in FIG. 9, during an on stage S0 of the display panel, the second reset terminal RST2 is a high level, and potentials of the first node and the signal output terminal OUTPUT in each stage of shift register circuits are pulled down. During a second off stage tXon2 in the off stage of the display panel, the second reset terminal RST2 is a high level, and potentials of the first node and the signal output terminal OUTPUT in each stage of shift register circuit are pulled down.

Figure 10:
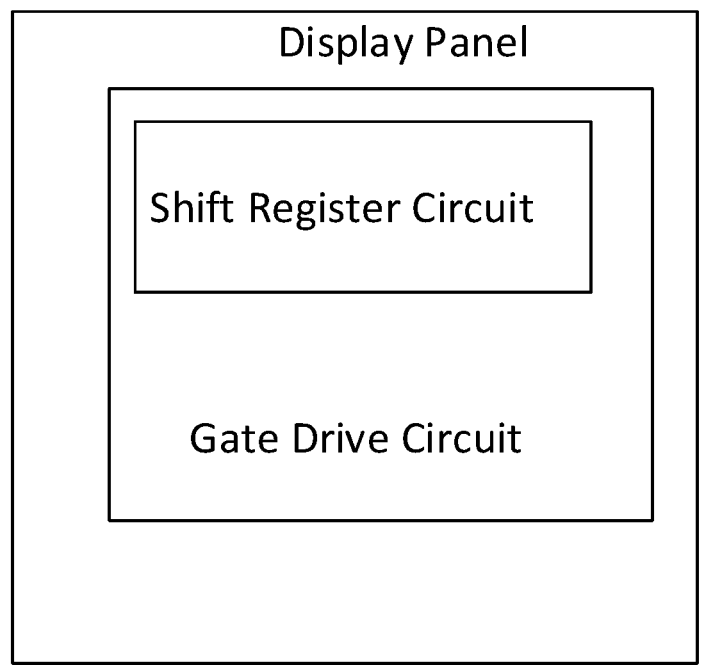
FIG. 10 is a structural schematic diagram of a display panel provided according to some embodiments of the present disclosure.

FIG. 10 is a structural schematic diagram of the display panel provided according to some embodiments of the present disclosure. As shown in FIG. 10, the display panel may comprise the aforementioned shift register circuits (for example, the shift register circuits as shown in FIGS. 3, 4 and 6) or gate drive circuit (the gate drive circuit as shown in FIG. 8). The display panel may be a liquid crystal panel, an electronic paper, an OLED panel, a mobile phone, a tablet computer, a TV set, a display, a laptop, a digital photo frame, a navigator, or any product or component having a display function.

In descriptions for embodiments of the present disclosure, it should be noted that, unless otherwise expressly stipulated and defined, terms "mount", "connected" and "connect" should be understood in a broad way. In some embodiments, they may be a fixed connection, a detachable connection, or an integrated connection; they may be a mechanical connection, or an electrical connection; they may be a direct connection, an indirect connection by an intermediate medium, or a communication within two elements. For those skilled in the art, specific meanings of the aforementioned terms in the present disclosure may be understood according to specific situations.

Although the embodiment modes as revealed in the present disclosure are as above, the stated contents are only embodiment modes used to facilitate the understanding of the present disclosure, instead of limits for the present disclosure. Any one skilled in the art may make any modification or change to forms and details of implementation, without deviating from spirit and scope as revealed in the present disclosure. However, the scope of patent protection of the present disclosure still must be subject to the scope as limited by the Claims attached thereto.

What is claimed is:

1. A shift register circuit, arranged in a display panel, comprising: an input circuit, an output circuit, a pull-down circuit, a first reset circuit, and a second reset circuit;

the input circuit connected to a signal input terminal and a first node and configured to provide a signal of the signal input terminal to the first node under control of the signal input terminal;

the output circuit connected to a clock signal terminal, the first node, and a signal output terminal and configured to provide a signal of the clock signal terminal to the signal output terminal under control of the first node;

the pull-down circuit connected to the first node, a first power source terminal, a second power source terminal, and the signal output terminal and configured to provide a signal of the second power source terminal to the first node and the signal output terminal under control of the first power source terminal;

the first reset circuit connected to a first reset terminal, the second power source terminal, the first node, and the signal output terminal and configured to provide a signal of the second power source terminal to the first node and the signal output terminal under control of the first reset terminal;

the second reset circuit connected to a second reset terminal, a third power source terminal, the first node, and the signal output terminal and configured to provide a signal of the third power source terminal to the first node and the signal output terminal under control of the second reset terminal, wherein the first reset circuit includes a third transistor and a fourth transistor;

of the third transistor, a gate is connected to the first reset terminal, a first electrode is connected to the first node, and a second electrode is connected to the second power source terminal;

of the fourth transistor, a gate is connected to the first reset terminal, a first electrode is connected to the signal output terminal, and a second electrode is connected to the second power source terminal; and wherein the second reset circuit includes a fifth transistor and a sixth transistor;

of the fifth transistor, a gate is connected to the second reset terminal, a first electrode is connected to the first node, and a second electrode is connected to the third power source terminal;

of the sixth transistor, a gate is connected to the second reset terminal, a first electrode is connected to the signal output terminal, and a second electrode is connected to the third power source terminal;

wherein the second reset circuit is further configured to provide the signal of the third power source terminal to the first node and the signal output terminal under control of the second reset terminal, during turn-on and turn-off stages of the display panel; and wherein a potential of a signal of the second power source terminal is less than that of the third power source terminal;

wherein during the turn-on and turn-off stages of the display panel, a potential of a signal of the first reset terminal is a potential to turn off the third transistor and the fourth transistor, and a potential of a signal of the second reset terminal is a potential to turn on the fifth transistor and the sixth transistor to pull a potential of the first node and the signal output terminal down to the potential of the signal of the third power source terminal, wherein the turn-off stage comprises a first turn-off stage and a second turn-off stage, wherein during the first turn-off stage, an input signal of the first reset terminal is a high level and an input signal of the second reset terminal is a low level, and during the second turn-off stage, the input signal of the first reset terminal is a low level and the input signal of the second reset terminal is a high level.

2. The shift register circuit according to claim 1, wherein the input circuit includes a first transistor;

of the first transistor, a gate and a first electrode are connected to the signal input terminal, a second electrode is connected to the first node;

the output circuit includes a second transistor and a capacitor;

of the second transistor, a gate is connected to the first node, a first electrode is connected to the clock signal terminal, and a second electrode is connected to the signal output terminal;

of the capacitor, one terminal is connected to the first node, and the other terminal is connected to the signal output terminal.

3. The shift register circuit according to claim 1, wherein the pull-down circuit includes a seventh transistor, an eighth transistor, a ninth transistor, and a tenth transistor;

of the seventh transistor, a gate and a first electrode are connected to the first power source terminal, and a second electrode is connected to a second node;

of the eighth transistor, a gate is connected to the first node, a first electrode is connected to the second node, and a second electrode is connected to the second power source terminal;

of the ninth transistor, a gate is connected to the second node, a first electrode is connected to the first node, and a second electrode is connected to the second power source terminal;

of the tenth transistor, a gate is connected to the second node, a first electrode is connected to the signal output terminal, and a second electrode is connected to the second power source terminal.

4. The shift register circuit according to claim 1, wherein the pull-down circuit includes a seventh transistor, an eighth transistor, a ninth transistor, a tenth transistor, an eleventh transistor, and twelfth transistor;

of the seventh transistor, a gate and a first electrode are connected to the first power source terminal, and a second electrode is connected to a third node;

of the eighth transistor, a gate is connected to the third node, a first electrode is connected to the first power source terminal, and a second electrode is connected to the second node;

of the ninth transistor, a gate is connected to the first node, a first electrode is connected to the third node, and a second electrode is connected to the second power source terminal;

of the tenth transistor, a gate is connected to the first node, a first electrode is connected to the second node, and a second electrode is connected to the second power source terminal;

of the eleventh transistor, a gate is connected to the second node, a first electrode is connected to the first node, and a second electrode is connected to the second power source terminal;

of the twelfth transistor, a gate is connected to the second node, a first electrode is connected to the signal output terminal, and a second electrode is connected to the second power source terminal.

5. The shift register circuit according to claim 1, wherein a potential of a signal of the second power source terminal is less than that of the third power source terminal.

6. A gate drive circuit, comprising:

a plurality of cascaded stages of the shift register circuit according to claim 1;

wherein a second reset terminal of each stage of the shift register circuit is connected to a reset terminal;

a signal input terminal of a first stage of the shift register circuit is connected to an initial signal input terminal;

a signal input terminal of an $N^{th}$ stage of the shift register circuit is connected to a signal output terminal of an $(N-1)^{th}$ stage of the shift register circuit; a signal output terminal of the $N^{th}$ stage of the shift register circuit is connected to a first reset terminal of the $(N-1)^{th}$ stage of the shift register circuit; wherein N is a positive integer greater than or equal to 2.

7. The gate drive circuit according to claim 6, wherein a clock signal terminal of an odd-numbered stage of the shift register circuit is connected to a first clock signal terminal, and a clock signal terminal of an even-numbered stage of the shift register circuit is connected to a second clock signal terminal;

wherein a signal of the first clock signal terminal is an inverted signal of a signal of the second clock signal terminal.

8. The gate drive circuit according to claim 6, wherein in each shift register circuit,
the input circuit includes a first transistor;
of the first transistor, a gate and a first electrode are connected to the signal input terminal, and a second electrode is connected to the first node;
the output circuit includes a second transistor and a capacitor;
of the second transistor, a gate is connected to the first node, a first electrode is connected to the clock signal terminal, and a second electrode is connected to the signal output terminal;
of the capacitor, one terminal is connected to the first node, and the other terminal is connected to the signal output terminal.

9. The gate drive circuit according to claim 6, wherein in each shift register circuit,
the input circuit includes a first transistor;
of the first transistor, a gate and a first electrode are connected to the signal input terminal, and a second electrode is connected to the first node;
the output circuit includes a second transistor and a capacitor;
of the second transistor, a gate is connected to the first node, a first electrode is connected to the clock signal terminal, and a second electrode is connected to the signal output terminal;
of the capacitor, one terminal is connected to the first node, and the other terminal is connected to the signal output terminal.

10. The gate drive circuit according to claim 6, wherein in each shift register circuit, the pull-down circuit includes a seventh transistor, an eighth transistor, a ninth transistor, and a tenth transistor;
of the seventh transistor, a gate and a first electrode are connected to the first power source terminal, and a second electrode is connected to a second node;
of the eighth transistor, a gate is connected to the first node, a first electrode is connected to the second node, and a second electrode is connected to the second power source terminal;
of the ninth transistor, a gate is connected to the second node, a first electrode is connected to the first node, and a second electrode is connected to the second power source terminal;
of the tenth transistor, a gate is connected to the second node, a first electrode is connected to the signal output terminal, and a second electrode is connected to the second power source terminal.

11. The gate drive circuit according to claim 6, wherein in each shift register circuit,
the pull-down circuit includes a seventh transistor, an eighth transistor, a ninth transistor, a tenth transistor, an eleventh transistor, and twelfth transistor;
of the seventh transistor, a gate and a first electrode are connected to the first power source terminal, and a second electrode is connected to a third node;
of the eighth transistor, a gate is connected to the third node, a first electrode is connected to the first power source terminal, and a second electrode is connected to the second node;

of the ninth transistor, a gate is connected to the first node, a first electrode is connected to the third node, and a second electrode is connected to the second power source terminal;
of the tenth transistor, a gate is connected to the first node, a first electrode is connected to the second node, and a second electrode is connected to the second power source terminal;
of the eleventh transistor, a gate is connected to the second node, a first electrode is connected to the first node, and a second electrode is connected to the second power source terminal;
of the twelfth transistor, a gate is connected to the second node, a first electrode is connected to the signal output terminal, and a second electrode is connected to the second power source terminal.

12. A display panel, comprising the shift register circuit according to claim 1.

13. A display panel, comprising the gate drive circuit according to claim 6.

14. A drive method of a shift register circuit, arranged in a display panel,
the shift register circuit comprising: an input circuit, an output circuit, a pull-down circuit, a first reset circuit, and a second reset circuit;
the input circuit connected to a signal input terminal and a first node and configured to provide a signal of the signal input terminal to the first node under control of the signal input terminal;
the output circuit connected to a clock signal terminal, the first node, and a signal output terminal and configured to provide a signal of the clock signal terminal to the signal output terminal under control of the first node;
the pull-down circuit connected to the first node, a first power source terminal, a second power source terminal, and the signal output terminal and configured to provide a signal of the second power source terminal to the first node and the signal output terminal under control of the first power source terminal;
the first reset circuit connected to a first reset terminal, the second power source terminal, the first node, and the signal output terminal and configured to provide a signal of the second power source terminal to the first node and the signal output terminal under control of the first reset terminal;
the second reset circuit connected to a second reset terminal, a third power source terminal, the first node, and the signal output terminal and configured to provide a signal of the third power source terminal to the first node and the signal output terminal under control of the second reset terminal;
wherein the first reset circuit includes a third transistor and a fourth transistor;
of the third transistor, a gate is connected to the first reset terminal, a first electrode is connected to the first node, and a second electrode is connected to the second power source terminal;
of the fourth transistor, a gate is connected to the first reset terminal, a first electrode is connected to the signal output terminal, and a second electrode is connected to the second power source terminal; and
wherein the second reset circuit includes a fifth transistor and a sixth transistor;
of the fifth transistor, a gate is connected to the second reset terminal, a first electrode is connected to the first node, and a second electrode is connected to the third power source terminal;

of the sixth transistor, a gate is connected to the second reset terminal, a first electrode is connected to the signal output terminal, and a second electrode is connected to the third power source terminal;

the method comprising:

during a turn-on stage of the display panel, under control of the second reset terminal, the second reset circuit provides a signal of the third power source terminal to the first node and the signal output terminal;

under control of the signal input terminal, the input circuit provides a signal of the signal input terminal to the first node;

under control of the first node, the output circuit provides a signal of the clock signal terminal to the signal output terminal;

under control of the first reset terminal, the first reset circuit provides a signal of the second power source terminal to the first node and the signal output terminal;

under control of the first power source terminal, the pull-down circuit provides a signal of the second power source terminal to the first node and the signal output terminal;

during a turn-off stage of the display panel, under control of the second reset terminal, the second reset circuit provides a signal of the third power source terminal to the first node and the signal output terminal;

wherein a potential of the signal of the second power source terminal is less than that of the third power source terminal, wherein during the turn-on and turn-off stages of the display panel, a potential of a signal of the first reset terminal is a potential to turn off the third transistor and the fourth transistor, and a potential of a signal of the second reset terminal is a potential to turn on the fifth transistor and the sixth transistor to pull a potential of the first node and the signal output terminal down to the potential of the signal of the third power source terminal, wherein the turn-off stage comprises a first turn-off stage and a second turn-off stage, wherein during the first turn-off stage, an input signal of the first reset terminal is a high level and an input signal of the second reset terminal is a low level, and during the second turn-off stage, the input signal of the first reset terminal is a low level and the input signal of the second reset terminal is a high level.

* * * * *